(12) United States Patent
Doyle et al.

(10) Patent No.: US 10,450,053 B2
(45) Date of Patent: Oct. 22, 2019

(54) METHODS USING PREDICTIVE SHIMMING TO OPTIMIZE PART-TO-PART ALIGNMENT

(71) Applicant: The Boeing Company, Chicago, IL (US)

(72) Inventors: Joseph D. Doyle, Mount Pleasant, SC (US); Christopher A. Greer, Wadmalaw Island, SC (US); Brian D. Smith, Charleston, SC (US); Richard M. Wcislak, Charleston, SC (US)

(73) Assignee: The Boeing Company, Chicago, IL (US)

( * ) Notice: Subject to any disclaimer, the term of this patent is extended or adjusted under 35 U.S.C. 154(b) by 188 days.

(21) Appl. No.: 15/151,577

(22) Filed: May 11, 2016

(65) Prior Publication Data

US 2017/0327201 A1 Nov. 16, 2017

(51) Int. Cl.
| | |
|---|---|
| *B64C 3/26* | (2006.01) |
| *B64F 5/10* | (2017.01) |
| *B23P 19/10* | (2006.01) |
| *G05B 19/418* | (2006.01) |
| *G01B 11/00* | (2006.01) |
| *G01B 11/14* | (2006.01) |
| *G06F 17/50* | (2006.01) |

(52) U.S. Cl.
CPC .................. *B64C 3/26* (2013.01); *B64F 5/10* (2017.01); *G01B 11/005* (2013.01); *G01B 11/14* (2013.01); *G06F 17/5086* (2013.01); *G06F 17/5095* (2013.01); *B23P 19/105* (2013.01); *G05B 19/41805* (2013.01)

(58) Field of Classification Search
CPC ......... B23P 19/04; B23P 19/10; B23P 19/102; B23P 19/105; B64C 3/26; B64F 5/00; B64F 5/10; G05B 19/41805; G16B 17/5086; G16B 17/5095
See application file for complete search history.

(56) References Cited

U.S. PATENT DOCUMENTS

| | | | |
|---|---|---|---|
| 6,618,505 B2 | 9/2003 | Cork et al. | |
| 8,756,792 B2 | 6/2014 | Boyl-Davis et al. | |
| 9,068,809 B1 | 6/2015 | Lagally et al. | |
| 9,213,786 B2 | 12/2015 | Glasscock et al. | |
| 2001/0046323 A1 | 11/2001 | Cork et al. | |
| 2005/0172470 A1 | 8/2005 | Cobb et al. | |
| 2008/0205763 A1 | 8/2008 | Marsh et al. | |
| 2009/0100791 A1* | 4/2009 | Kayani ................... B64C 3/187 52/745.19 |
| 2014/0303764 A1 | 10/2014 | Boyl-Davis et al. | |
| 2015/0276376 A1 | 10/2015 | Lagally et al. | |

OTHER PUBLICATIONS

Extended European Search Report dated Oct. 26, 2017 in European Patent Application No. 17169820.2 (European counterpart of the instant patent application).

* cited by examiner

*Primary Examiner* — Christopher J Besler
(74) *Attorney, Agent, or Firm* — Ostrager Chong Flaherty & Broitman P.C.

(57) ABSTRACT

Methods for using predictive shimming to optimize part-to-part alignment. In accordance with one embodiment, the process uses measurement data acquired from mating surfaces and key features to virtually align two parts in a manner that optimizes the final orientation of the parts and determines the geometry of the shim needed to achieve this orientation during assembly.

12 Claims, 9 Drawing Sheets

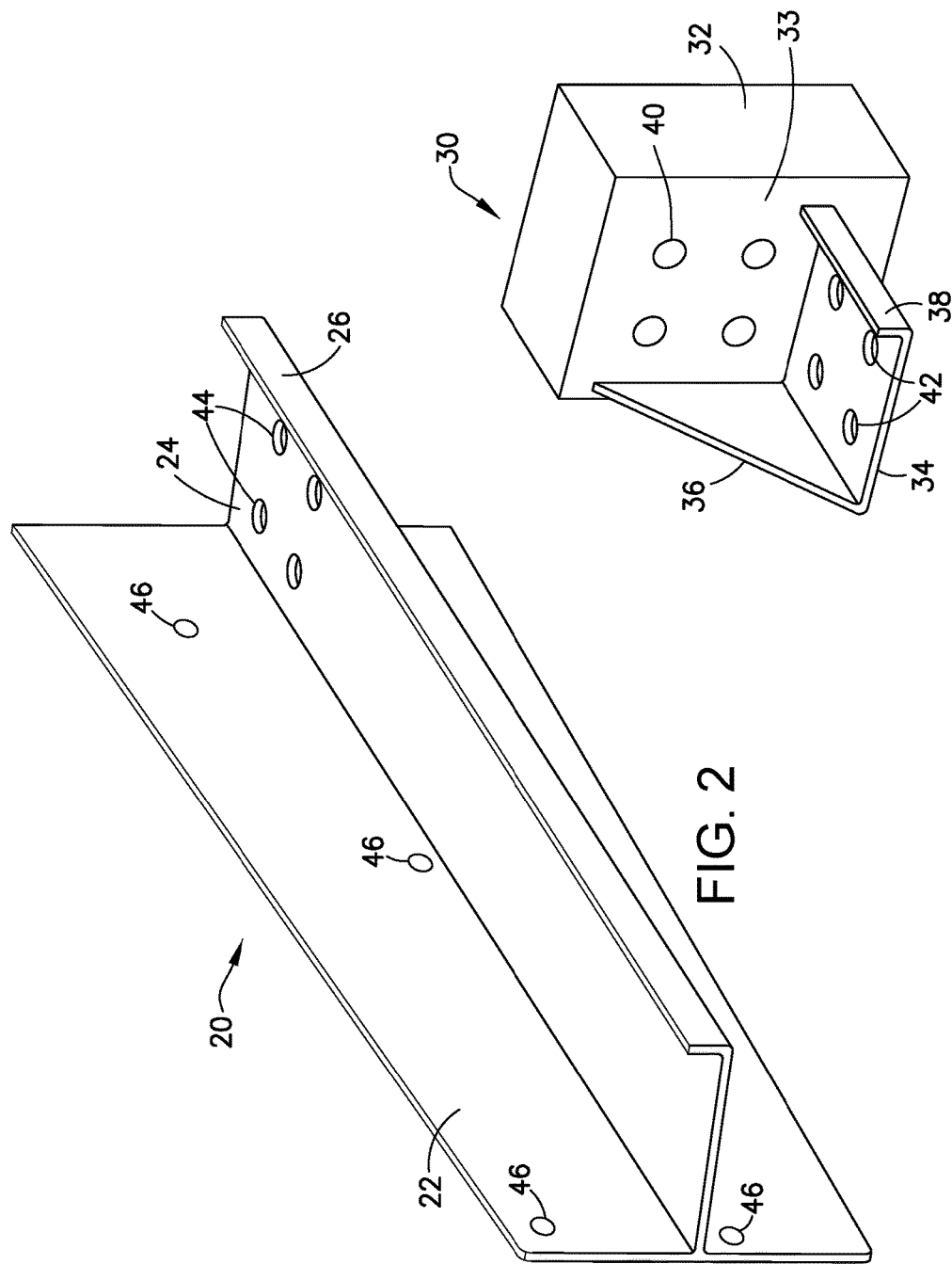

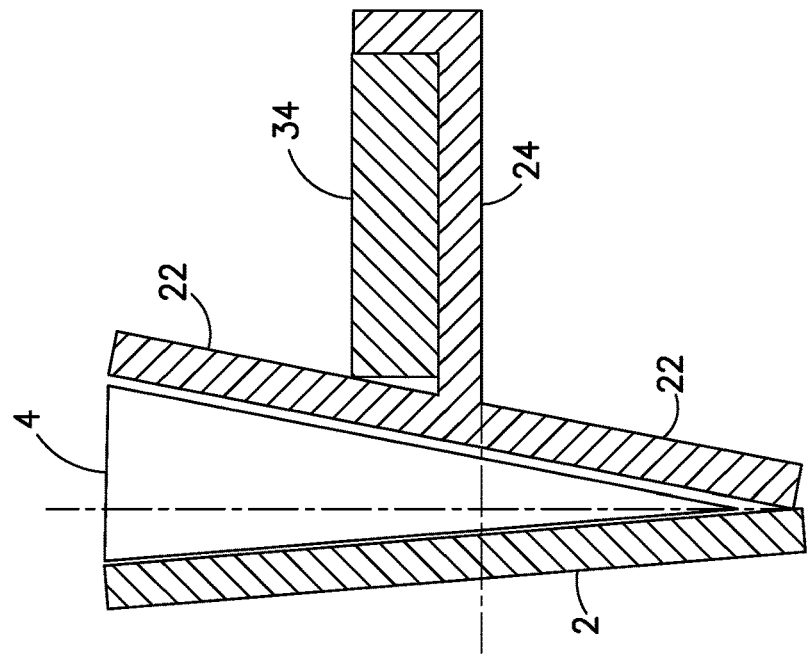
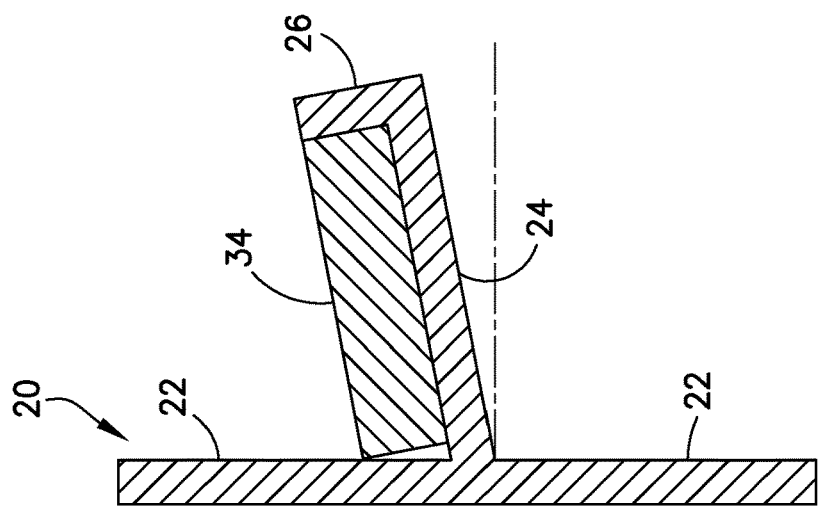
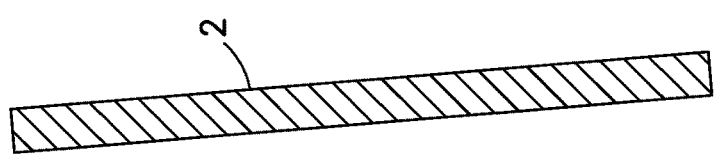
FIG. 6
FIG. 5
FIG. 4

METHODS USING PREDICTIVE SHIMMING TO OPTIMIZE PART-TO-PART ALIGNMENT

BACKGROUND

The present disclosure relates generally to locating and shimming one part relative to another part, such as parts constructed and assembled for aircraft or ships.

Determinate assembly (DA) is a method of aligning parts using mating physical features. Typically, coordinating holes which are placed on each part or structure are used to take advantage of the ability to install temporary fasteners to hold the parts together. The parts of a determinate assembly are sometimes required to be joined together with an accuracy that is within a specified tolerance.

During the assembly of aircraft parts, it may be necessary to affix parts to one another such that any gap between the two parts is occupied by filler material, commonly referred to as a "shim". Typically, this is done by temporarily installing the parts and checking to see if any gaps exist. When the gap exceeds a specified tolerance, a shim or similar filler may be inserted into the gap in order to assure a within-tolerance fit between the parts. Shims can be used to fill voids discovered during an assembly process. Voids are typically formed by the misalignment of parts during assembly or by variation in manufacture of the parts being assembled. Although mostly used on an as-needed basis during manufacturing, some shims are called out on drawings as part of the manufacturing process. Shims are used throughout the aerospace industry to compensate for part variation due to the complex aerodynamic shapes of various assembled parts.

Manual shimming requires the parts to be installed and measured, fillers to be fabricated and installed, and gaps to be checked. Measuring gaps is a time-consuming process and fabricating the fillers after part installation requires additional production flow. In recent years, a process called predictive shimming has been developed to reduce the manufacturing time and cost associated with shimming activities. Predictive shimming typically involves measuring the mating surfaces of the parts prior to assembly, performing a virtual assembly of the parts, estimating the resulting gap between the parts, and then fabricating a filler prior to assembly. The filler (hereinafter "shim") is designed to fill the gap between the mating parts.

While past predictive shimming efforts have used measurement data for virtual assembly, these processes only use measurements from the mating features, including holes or surfaces used to attach the parts, and merely minimize the gap between the parts. Previous predictive shimming processes use measurement data of mating surfaces to fill gaps. These processes have not focused on optimizing the final orientation of the parts, but rather merely seek to fill gaps between two parts. More specifically, previous predictive shimming efforts did not consider key features of the two parts. Key features are orientations and measurements specified by engineering requirements that must be satisfied after assembly of the parts is completed.

There is need for a method of locating and shimming one part relative to another part which is capable of taking into account a key feature of the one part.

SUMMARY

This subject matter disclosed herein is directed to methods for using predictive shimming to optimize part-to-part alignment. In accordance with one embodiment, the process uses measurement data acquired from mating surfaces and key features to virtually align two parts in a manner that optimizes the final orientation of the parts and determines the geometry of the shim needed to achieve this orientation during assembly.

This process enables, prior to assembly, the fabrication of shims that optimize part orientation during assembly. By fabricating shims prior to assembly, this process reduces production flow and can reduce critical path flow. By using measurement data to virtually align the parts, one can determine the filler geometry needed to optimize the final part orientation. For example, consider the example of an L-shaped bracket that will be used as a shelf with one surface affixed to a wall. If the two surfaces of the L-shaped bracket are not perpendicular, the result will be a shelf that tips up or down relative to a horizontal plane. Using the process disclosed herein, one would measure the L-shaped bracket, virtually locate the bracket relative to a wall in a manner that ensures that the shelf surface will be level (i.e., horizontal), and then compute the dimensions of a virtual gap between the virtually located bracket and wall to determine the filler geometry needed to ensure that the shelf surface in the final assembly is within a specified tolerance of being level.

The approach described in detail below uses measurements of key features to perform virtual part alignments and then determines the filler geometry needed to both fill the gaps between the assembled parts and also to ensure that the parts are properly aligned. This enables a method of fabricating shims that reduces variation in the build process, eliminates nonconformities, and reduces production flow.

The process disclosed herein is a metrology-directed, DA hole placement method coupled with a predictive shimming method using a suite of metrology and three-dimensional (3-D) CAD tools. In accordance with one implementation, this method can be used to shim a structural component to a skin of an aircraft. This method would be applicable for accurately shimming many different types of structural components on an aircraft or ship. Predictive shimming is achieved by virtually fitting a structural component to a skin per engineering requirements, taking into account at least one key feature of the structural component which has a specified location in an engineering model. The variation in the size of the gap between first and second virtual surfaces respectively fitted to the mating surfaces of the structural component and the skin are then used to develop a shimming model.

One aspect of the subject matter disclosed herein is a method for fabricating a shim fittable between first and second parts, comprising: (a) measuring a first mating surface, a key feature and mating features of a first part to obtain first measurement data in a frame of reference of a measurement system; (b) measuring a second mating surface and mating features of the second part to obtain second measurement data in the frame of reference of the measurement system; (c) aligning the first measurement data to first engineering location data that represents a specified location of the first part in a frame of reference of an engineering model, giving priority to virtual alignment of the key feature with its associated engineering location; (d) aligning the second measurement data to second engineering location data that represents a specified location of the second part in the frame of reference of the engineering model; (e) fitting a first virtual surface to a measurement data set of the first aligned measurement data corresponding to the first mating surface; (f) fitting a second virtual surface to a measurement data set of the second aligned measurement data corresponding to the second mating surface; (g) estimating gaps between the first and second virtual surfaces to obtain estimated gaps; and (h) fabricating a shim having a thickness which varies as a function of the estimated gaps. In accordance with one embodiment, step (c) comprises using a weighted fit algorithm to align the first measurement data to the first engineering location data, the weighted fit algorithm comprising weighting that prioritizes alignment of the key feature with its associated engineering location.

The method described in the preceding paragraph may further comprise using the estimated gaps to develop a shim model, wherein step (h) comprises fabricating the shim in accordance with the shim model. In accordance with some embodiments, the shim has a flat surface and a non-flat surface, the distance between the flat and non-flat surfaces of the shim being equal to the thickness.

In accordance with some embodiments, the key feature is a surface of the first part. However, the concepts disclosed herein are not limited in their application to situations wherein the key feature is a surface. For example, in accordance with alternative embodiments the key feature could be a projection or a hole. In some implementations, the first part is a structural component (e.g., a longeron or strut fitting) of an aircraft and the second part is a skin (e.g., a fuselage or wing skin) of the aircraft.

Another aspect of the subject matter disclosed herein is a method for attaching a structural component to a skin of an aircraft, comprising: (a) using a measurement system to measure a first mating surface, a key feature and mating features of a structural component of an aircraft to obtain first measurement data in a frame of reference of the measurement system; (b) using the same or a different measurement system to measure a second mating surface and mating features of a skin of the aircraft to obtain second measurement data in a frame of reference of the same or different measurement system; (c) aligning the first measurement data to first engineering location data that represents a specified location of the structural component in a frame of reference of an engineering model, giving priority to virtual alignment of the key feature with its associated engineering location; (d) aligning the second measurement data to second engineering location data that represents a specified location of the skin in the frame of reference of the engineering model; (e) fitting a first virtual surface to a measurement data set of the first aligned measurement data corresponding to the first mating surface; (f) fitting a second virtual surface to a measurement data set of the second aligned measurement data corresponding to the second mating surface; (g) estimating gaps between the first and second virtual surfaces to obtain estimated gaps; (h) fabricating a shim having a thickness which varies as a function of the estimated gaps; and (i) assembling the structural component and the skin of the aircraft with the shim therebetween.

A further aspect of the subject matter disclosed herein is a method for fabricating a shim fittable between first and second parts, comprising: (a) measuring a location of a surface of a first portion of a first part, a location of a surface of a second portion of the first part, and locations of holes in the first part to obtain first measurement data in a frame of reference of a measurement system; (b) measuring a location of a surface of a second part and locations of holes in the second part to obtain second measurement data in the frame of reference of the measurement system; (c) aligning the first measurement data to first engineering location data that represents a specified location of the first part in a frame of reference of an engineering model, giving priority to virtual alignment of the surface of the second portion of the first part with its associated engineering location; (d) aligning the second measurement data to second engineering location data that represents a specified location of the second part in the frame of reference of the engineering model; (e) fitting a first virtual surface to a measurement data set of the first aligned measurement data corresponding to the surface of the first portion of the first part; (f) fitting a second virtual surface to a measurement data set of the second aligned measurement data corresponding to the surface of the second part; (g) estimating gaps between the first and second virtual surfaces to obtain estimated gaps; and (h) fabricating a shim having a thickness which varies as a function of the estimated gaps.

Other aspects of methods for fabricating shims using predictive shimming that takes into account one or more key features of a part to be assembled are disclosed in detail below.

BRIEF DESCRIPTION OF THE DRAWINGS

FIG. 2 is a diagram representing an isometric view of the longeron depicted in FIG. 1.

FIG. 3 is a diagram representing an isometric view of the end fitting depicted in FIG. 1.

FIG. 4 is a diagram representing a sectional view of a portion of a fuselage skin of an aircraft.

FIG. 5 is a diagram representing a sectional view of a longeron and an end fitting attached to the longeron, the section being taken along a plane that is substantially perpendicular to an axis of the longeron.

FIG. 6 is a diagram representing a sectional view of an assembly comprising the portion of the fuselage skin depicted in FIG. 4, the longeron and end fitting depicted in FIG. 5, and a shim fabricated in accordance with a method disclosed herein, the shim being fitted between the skin and a flange of the longeron.

Reference will hereinafter be made to the drawings in which similar elements in different drawings bear the same reference numerals.

DETAILED DESCRIPTION

A shimming process will now be described with reference to certain embodiments. In accordance with the embodiments disclosed herein, this shimming process is used to locate and shim a structural component on a skin of an aircraft. While a primary use of the embodiments disclosed herein is in the field of aircraft construction and assembly, the teachings herein have application in other types of construction and assembly, including, for example, shipbuilding, automobile manufacture, building construction and the like.

The predictive shimming process disclosed herein uses measurements of mating surfaces, measurements of mating features (such as holes or projections used to attach the parts) and measurements of a key feature to ensure that the key feature is correctly oriented once the parts have been assembled with a shim therebetween. For this approach, it is acceptable to use thick shims to optimize the final alignment of the parts.

In accordance with one embodiment disclosed in detail below, predictive shimming is used to virtually locate a key feature of a longeron relative to a fuselage skin of an aircraft per engineering requirements. When the key feature is properly located relative to the fuselage skin in a virtual assembly, in many cases the mating surfaces of the longeron and fuselage skin will be separated by a virtual gap. That virtual gap is used to develop a shimming model. A shim is then fabricated in accordance with the shimming model and installed between the longeron and the fuselage skin during assembly.

Figure 1:
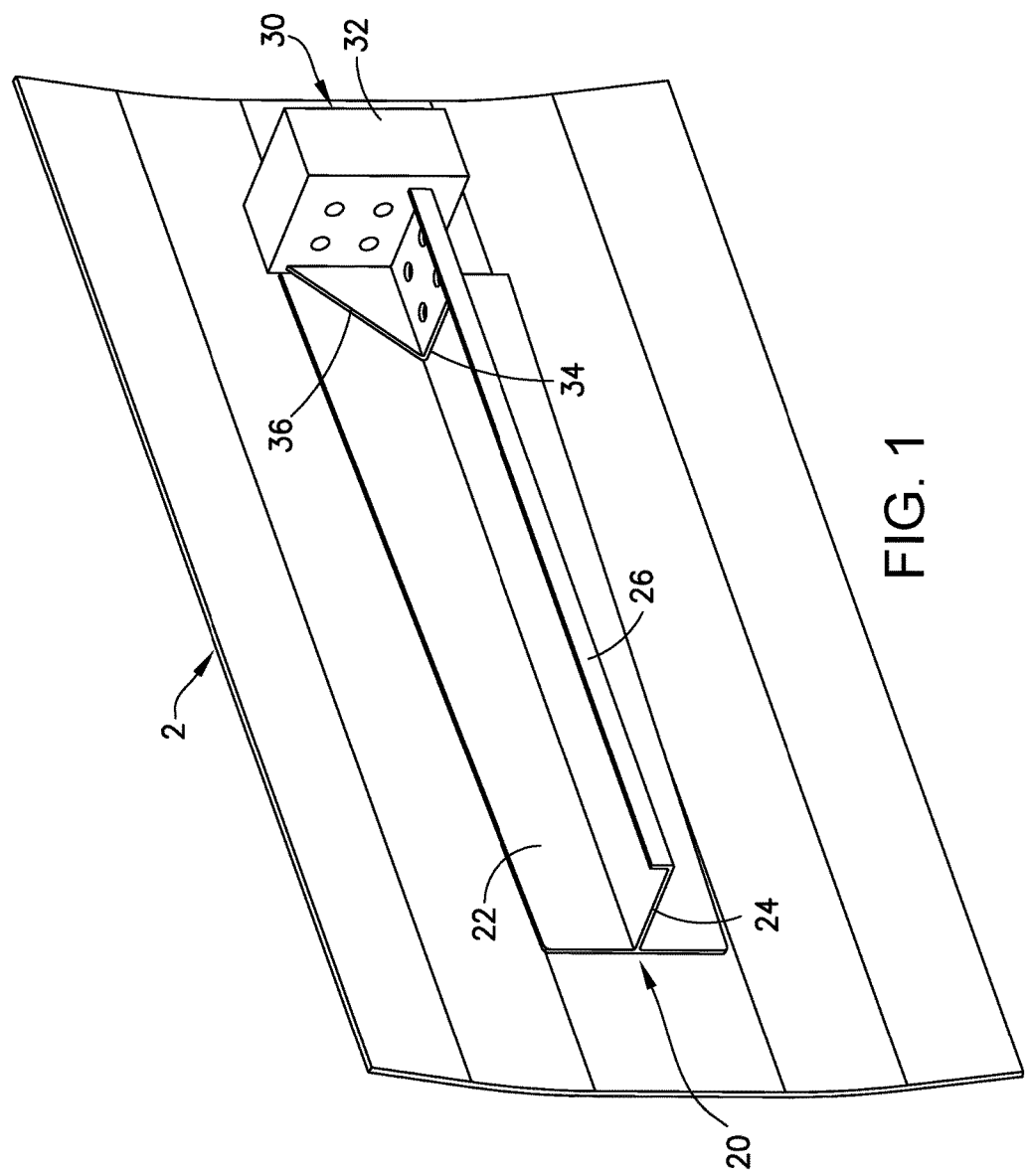
FIG. 1 is a diagram representing an isometric view of a longeron attached to a fuselage skin of an aircraft, with an end fitting attached to one end of the longeron.

FIG. 1 shows an isometric view of a longeron 20 attached to a fuselage skin 2 of a fuselage section of an aircraft (only a portion of the fuselage skin 2 is shown in FIG. 1). As best seen in FIG. 2, the longeron 20 comprises a longeron flange 22, a longeron web 24 and a longeron lip 26. In some implementations, the longeron web 24 may be perpendicular to the longeron flange 22.

In this example, the longeron flange 22 has four holes 46 for attaching the longeron flange 22 using fasteners (not shown in FIG. 1) which are inserted in corresponding holes in the fuselage skin 2. Similarly, one end of the longeron web 24 has four holes 44 for attaching the end fitting 30 in the position shown in FIG. 1.

As best seen in FIG. 3, the end fitting 30 comprises a fitting cap 32 having a wall 33 with a plurality of holes 40 for receiving respective fasteners to attach another structural component of the aircraft to the end fitting 30. The end fitting 30 further comprises a fitting web 34 which extends horizontally from the wall 33 of the fitting cap 32. The fitting web 34 has a plurality of holes 42 for receiving respective fasteners during attachment of the end fitting 30 to the longeron web 24. The engineering requirements specify that the holes 42 in the fitting web 34 be respectively aligned with the holes 44 in the longeron web 24. The end fitting 30 is strengthened by the presence of a triangular fitting angle 36 having one side welded to fitting cap 32 and another side welded to one edge of the fitting web 34, while the other edge of the fitting web 34 is welded to or integrally formed with a fitting lip 38.

In the assembly shown in FIG. 1, the end fitting 30 is supported by the longeron web 24 of the longeron 20 by means of the fitting web 34, which is fastened to longeron web 24 by means of fasteners (not shown in FIG. 1). The fitting web 34 extends from the fitting cap 32 and sits on top of the longeron web 24 of the longeron 20. In some implementations, the top surface of the longeron web 24 may be required to be disposed horizontally at a specified height or have some other specified position and orientation relative to the aircraft frame of reference. If the longeron web 24 is installed out of tolerance, then it is possible that the end fitting 30 will be misaligned (i.e., not oriented in accordance with an engineering requirement) in the final assembly. The predictive shimming process disclosed in detail below solves this problem.

To illustrate the problem, FIG. 4 is a diagram representing a sectional view of a portion of a fuselage skin 2 of the aircraft, while FIG. 5 is a diagram representing a sectional view of the fitting web 34 (of the end fitting 30) attached to the longeron web 24 of the longeron 20. In the exemplary situation depicted in FIG. 5, the dashed-dotted horizontal line represents the target height and angular position of the bottom surface of longeron web 24 in accordance with the specifications of one engineering model, while longeron web 24 is shown in a misaligned state, i.e., the angular position of the bottom surface of longeron web 24 deviates from 0 degrees (horizontal) as might be specified by engineering requirements.

In the assembled state, the misalignment of longeron web 24 may be due to variation and fluctuation in the contour of the fuselage section or variation in the fabrication of the longeron. FIG. 6 is a diagram representing a sectional view of an assembly comprising the portion of the fuselage skin 2 depicted in FIG. 4, the longeron web 24 and fitting web 34 depicted in FIG. 5, and a shim 4 fabricated in accordance with the method disclosed herein, the shim 4 being sized and shaped to fit between the fuselage skin 2 and longeron flange 22 in a manner that minimizes the angular deviation of longeron web 24 from a horizontal plane (or other specified plane). The method of predictive shimming disclosed herein is designed to ensure that the end fitting 30, when attached to longeron web 24, will be oriented at a specified angular position in the aircraft frame of reference.

In accordance with one embodiment, the predictive shimming process uses 3-D measurement data acquired from both skin 2 and longeron 20. Utilizing both data sets, a filler geometry is created to optimize the longeron orientation. For the purpose of this specific application of the predictive shimming process, the longeron web 24 is the key feature for assembly of these parts. It is important to ensure the longeron web 24 is virtually aligned to its engineering location prior to creating the shim 4. To ensure that the part alignment is optimized, a predictive shimming process may be employed. This predictive shimming process entails measuring surfaces and mating features, such as holes in skin 2 and longeron flange 22. More specifically, the surface of skin 2 that will mate with longeron 20, the surface of longeron flange 22 that will mate with skin 2, and the top surface of longeron web 24 (which supports the end fitting 30) are measured. Also the positions of the respective sets of DA holes 46 in longeron flange 22 and corresponding DA holes (not shown) in skin 2 are measured using a measurement probe. The longeron and skin measurement data sets are then used in a virtual assembly process. During the virtual assembly, the longeron orientation is optimized relative to the aircraft coordinate system to estimate the varying thickness of a shim 4 having a flat surface on one side. The thickness of such a shim will vary, that thickness being measured in a direction normal to the flat surface at a multiplicity of points scattered across the flat surface. More specifically, the distance between the flat and non-flat surfaces of the shim along a line normal to any point on the flat surface will be the thickness of the shim at that point.

Figure 7:
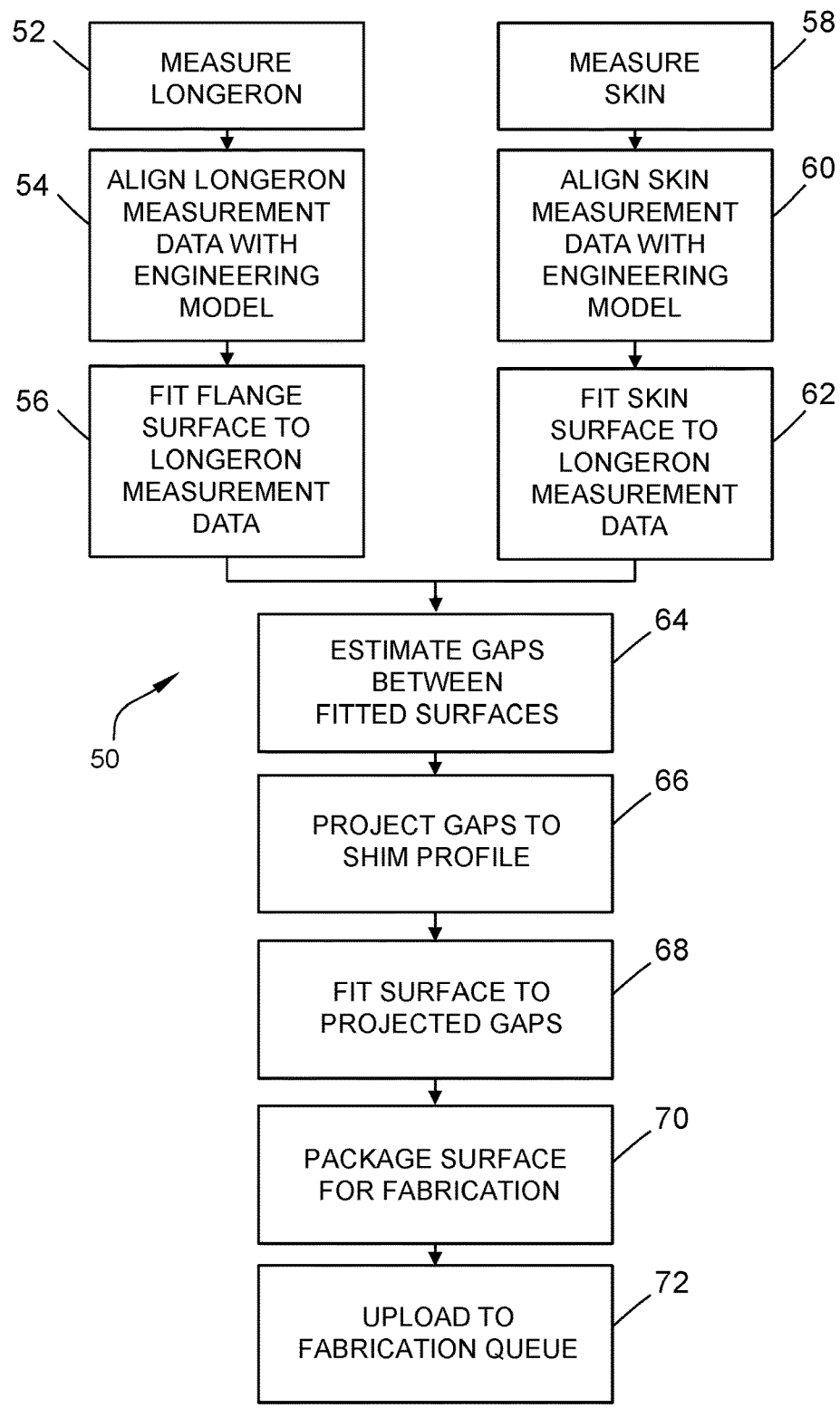
FIG. 7 is a flowchart identifying steps of a method for fabricating a shim in accordance with one embodiment.

FIG. 7 is a flowchart identifying steps of a method 50 for fabricating a shim 4 in accordance with one embodiment. For the longeron 20, one set of mating features and two surfaces are measured (step 52). The set of mating features measured is the collection of DA holes 46 that will be used to affix the longeron 20 to the skin 2. The first surface is the mating surface of the longeron flange 22, i.e., the region of the longeron flange 22 that will mate to the skin 2. The second surface is the top surface of the longeron web 24. This measurement focuses on the area where the end fitting 30 will be installed.

For the skin 2, one set of mating features and one surface is measured (step 58). The set of features measured is the collection of DA holes (not shown in the drawings) that will be used to affix the longeron 20 to the skin 2. The measured skin surface is the region of the skin 2 that mates with the longeron flange 22 during assembly.

This predictive shimming process uses well-known and commercially available 3-D metrology equipment to measure the surfaces and features of the parts. The surface measurements are taken with a laser scanner and they are stored as high-density point clouds. The mating feature (e.g., hole) measurements are taken with a measurement probe and the mating feature data is stored as discrete points.

After the measurement data has been acquired, that measurement data will be aligned with an engineering model that specifies the locations of all parts in the final assembly. The longeron measurements are loaded into a computer application used to align measurement data sets to engineering models. That computer application can be configured to align the longeron measurement data to an engineering model of the assembled skin/longeron (step 54 in FIG. 7). This alignment process uses a weighted fit algorithm to align the measured web, flange, and holes to their engineering locations. The weighting is done in a manner that prioritizes alignment of the virtual web (e.g., the top or bottom surface thereof) and allows the virtual longeron to rotate and translate to minimize the error in the web alignment.

In addition, the skin measurements are loaded into the same computer application used to align measurement data sets to engineering models. That computer application is configured to align the skin measurement data to the engineering model of the assembled skin/longeron (step 60 in FIG. 7) using a best fit algorithm to align the skin 2 and its DA holes to their respective engineering locations.

Alignment steps 54 and 60 are new additions to predictive shimming. Typically, the two mating surfaces would be aligned to one another to minimize the gap between the parts. However, this new process aligns both sets of measurements to engineering to optimize the final part alignment rather than simply minimizing gaps between the two parts. The step 54 uses a sequence of weighted fits to prioritize alignment of the longeron web 24 over alignment of other surfaces or features.

Unaligned measurement data is any measurement data that has a frame of reference different from a desired frame of reference. In the example of a longeron, the reference frame for the aligned measurement data is the aircraft reference frame. The unaligned measurement data is acquired within the frame of reference associated with the measurement system. When the unaligned measurement data is aligned to the engineering model, a weighted fit (longeron) or best fit (skin) analysis is run to determine the coordinate transformation matrix for converting from the measurement system frame of reference to the aircraft frame of reference. After those analyses have been performed, the coordinate transformation matrix is used to convert the unaligned measurement data so that it is aligned with respect to the aircraft frame of reference.

Still referring to FIG. 7, the aligned longeron web measurement data is exported from the alignment application and imported into an application used to fit a first virtual surface to the mating surface of longeron flange 22 as represented by the longeron measurement data (step 56). Likewise the aligned skin measurement data is exported from the alignment application and imported into an application used to fit a second virtual surface to the mating surface of skin 2 as represented by the skin measurement data (step 62).

Still referring to FIG. 7, the first and second virtual surfaces that were fitted to the aligned measurement data are imported into a program which is configured to estimate the sizes of the gaps between the first and second virtual surfaces (step 64). This program uses a grid of points between the fitted first and second virtual surfaces to estimate what the gap will be at each grid point when the parts are assembled. Two groups of vectors are created during this step: one is a set of vectors from the grid of points to the first virtual surface and the other is a set of vectors from the grid of points to the second virtual surface.

After the gaps have been estimated, those estimated gaps are projected to a 2-D shim profile (step 66). Since one side of the shim is flat and one side is machined, the two vector groups are merged together and the variation is pushed to one side. This is done by applying a positive offset to the most negative vector so that its magnitude is the minimum allowable shim thickness. This same offset is applied to all of the other vectors resulting in a vector field that is entirely positive but retains the shape of the merged vector field. Then, these vectors are mapped to the 2-D shim profile such that the vectors start at the flat side of the shim and end at the shim surface. If the resulting vectors exceed the maximum allowable shim thickness, the vectors may be scaled to prevent the shims from creating a nonconforming condition.

After the gaps have been projected to the shim profile, a virtual surface is fitted to the projected gaps (step 68). More specifically, once the vectors are mapped to the 2-D shim profile, their end points are used to construct a virtual fitted surface that represents the final machined surface of the shim. The virtual surface fitted to the gaps projected onto the 2-D shim profile are then packaged with XML metadata (step 70) that will be used by the fabrication shop to identify minimum/maximum thicknesses, customers, requesting departments, and part numbers. The packaged shim profile is then uploaded to the fabrication queue (step 72). Once the shim has been fabricated, the shim is delivered to a work cell where it is installed with the longeron. The foregoing process can be repeated for each longeron to be shimmed to the aircraft fuselage.

Figure 8:
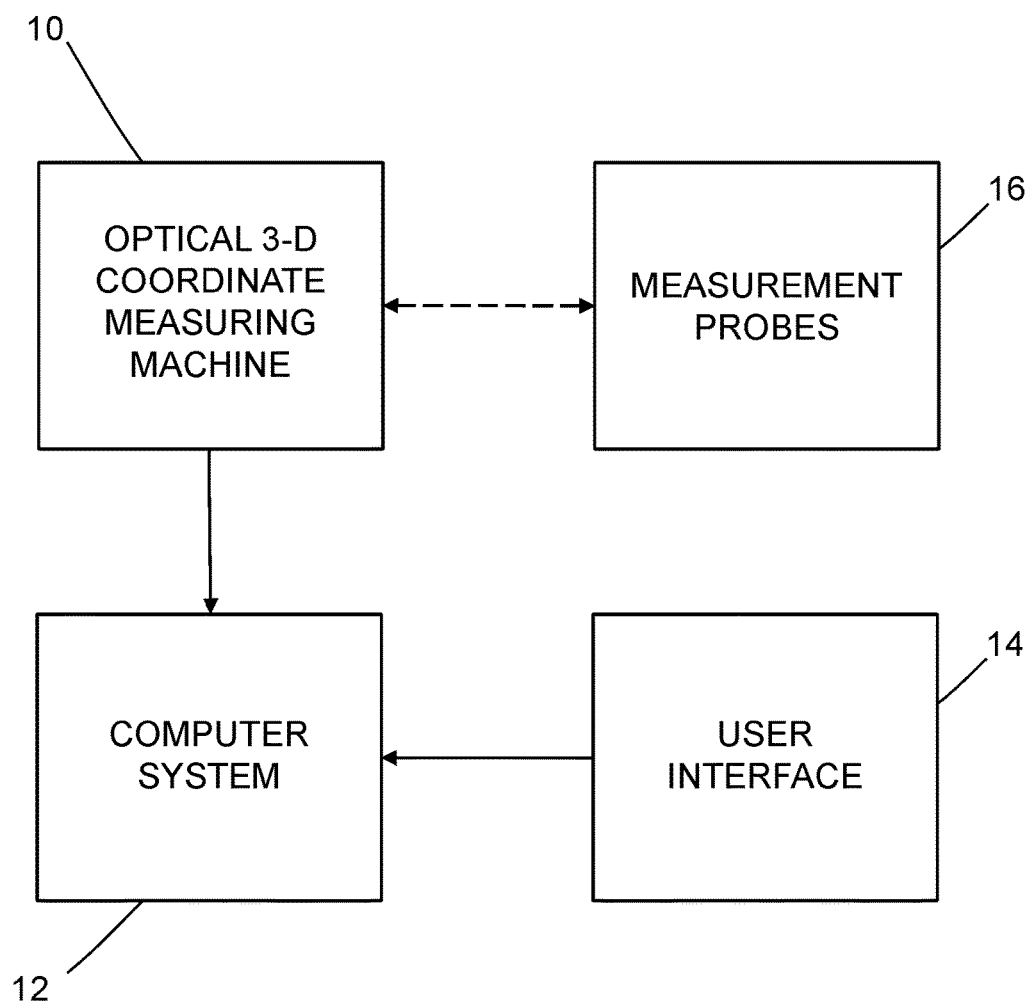
FIG. 8 is a block diagram showing the architecture of a system for generating a shim model based on surface data collected by a metrology system from the parts to be shimmed.

FIG. 8 is a block diagram showing the architecture of a system for generating a shim model based on measurement data collected by a metrology system from the parts to be shimmed. The metrology system may comprise an optical 3-D coordinate measuring machine 10 configured to measure (in its own frame of reference) 3-D coordinates of optically reflective elements in its field of view and then store a high-density point cloud representing the scanned surface. In accordance with one implementation, a photogrammetric tool (e.g., a TRITOP$^{CMM}$ system commercially available from Gesellschaft für Optische Messtechnik) is employed.

The metrology system further comprises a multiplicity of measurement probes 16 (described below with reference to FIGS. 10A and 10B) which are used to acquire X,Y,Z data that can be used to compute the locations of DA holes in the parts in the frame of reference of the 3-D coordinate measuring machine 10. More specifically, the 3-D coordinate measuring machine 10 computes the location of the axis of each DA hole. The measured axis of the hole is referred to herein as the "measured hole vector", and the data representing that axis location measurement is referred to herein as "hole vector data". The 3-D coordinate measuring machine 10 generates hole vector data based on the X,Y,Z data provided by the measurement probes 16. The hole vector data for all DA holes of interest is stored as discrete points.

A control computer 12 is configured to receive point cloud data and hole vector data from the optical 3-D coordinate measuring machine 10 and also receive commands and data input by a system operator via a user interface 14. The control computer 12 is further configured (e.g., programmed) to perform all of the steps identified in FIG. 7 except for the measuring steps 52 and 58.

Figure 9:
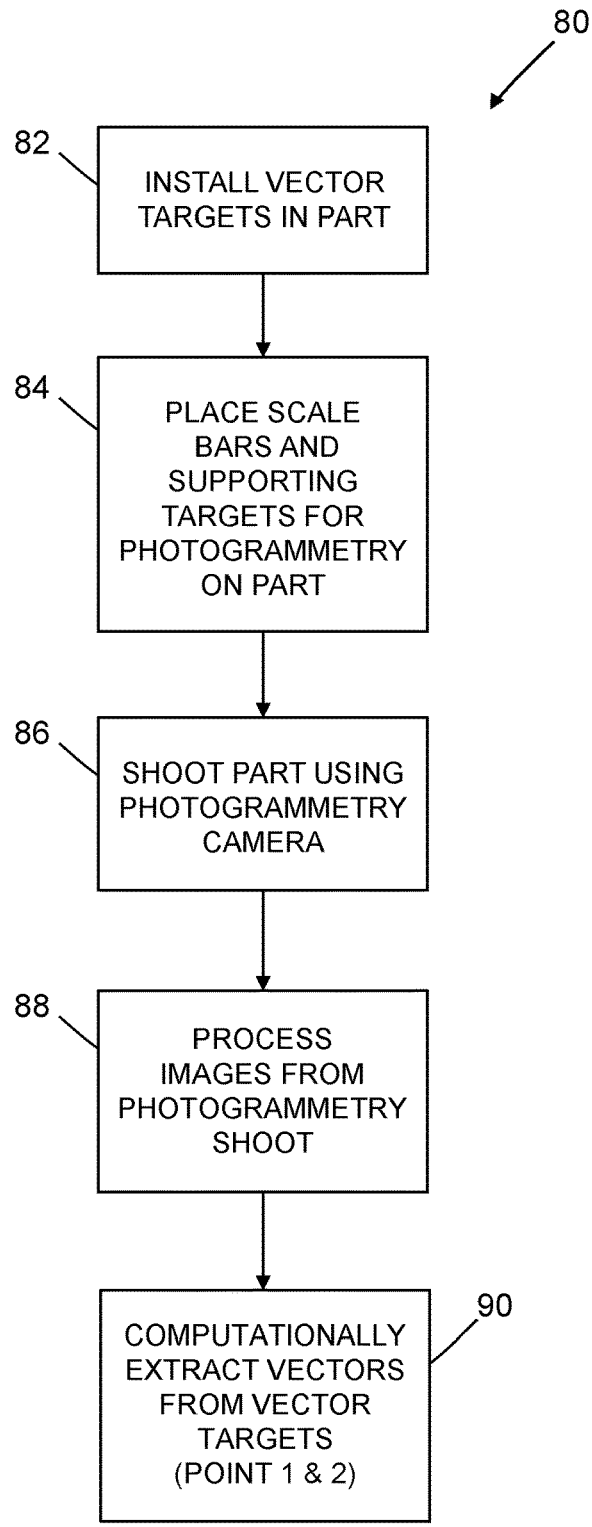
FIG. 9 is a flowchart identifying steps of a method for determining the location of a determinate assembly hole in a part using photogrammetry.

FIG. 9 is a flowchart showing steps of a method for determining the position of a center axis of a DA hole in a part in accordance with one embodiment. A measurement probe in the form of an optical target (see vector target 114 in FIGS. 10A and 10B) is inserted in a DA hole 8 in a part 6 (step 82). Then scale bars and supporting optical targets for photogrammetry are placed on the part surface (step 84). Then the metrology system operator captures the location of the vector target 114 using, for example, a photogrammetry camera (step 86). The images from the photogrammetry shoot are processed in a well-known manner (step 88). Vectors (i.e., measured hole vectors characterized by the locations of two points) are computationally extracted from photogrammetric data acquired from the vector target 114 in FIG. 10B (step 90).

Figure 10A:
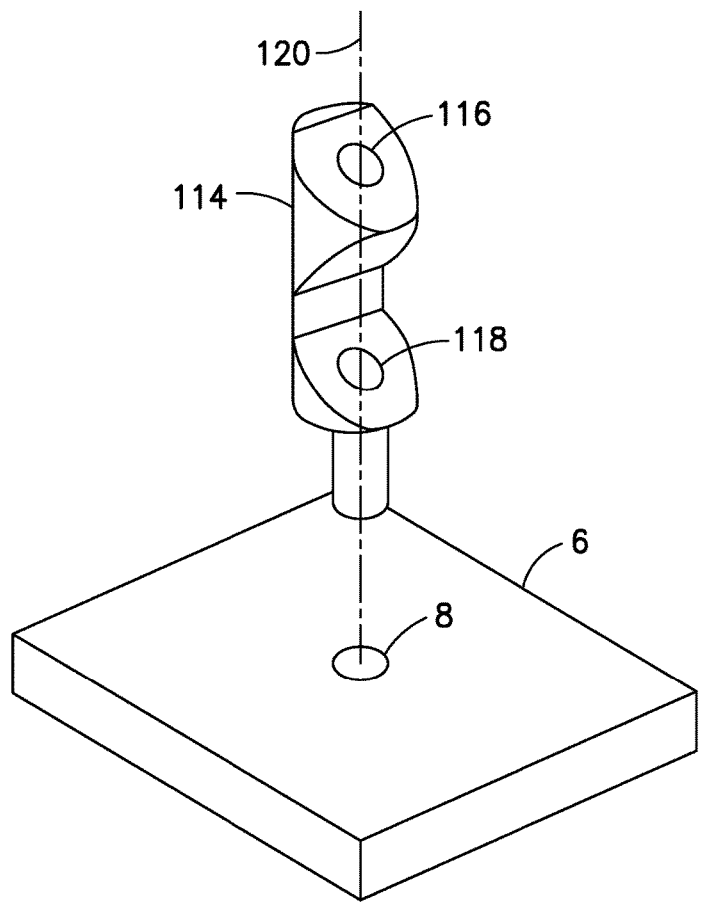
FIGS. 10A and 10B are schematic views showing a vector target disposed above (FIG. 10A) and installed inside (FIG. 10B) a determinate assembly hole. The dashed line through the vector target represents a measured hole vector.
Figure 10B:
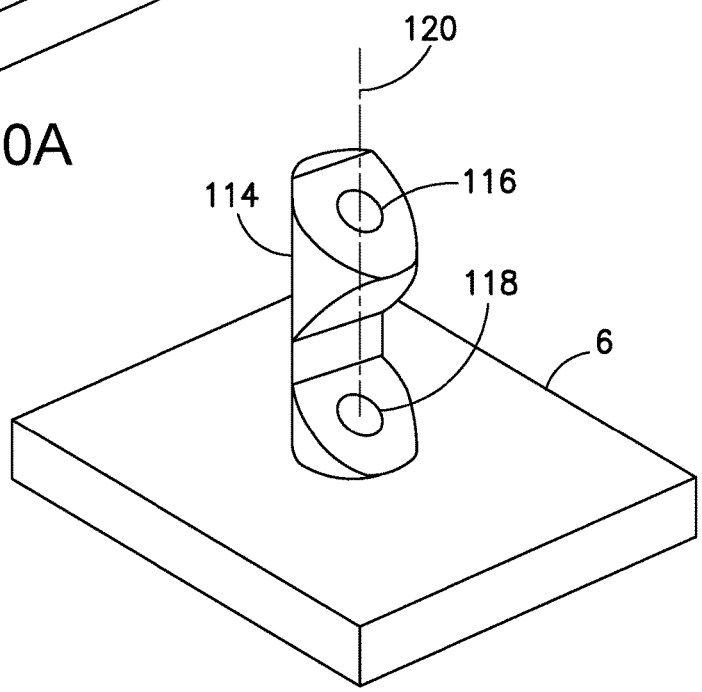

FIGS. 10A and 10B are schematic views showing a vector target 114 disposed above (FIG. 10A) and installed inside (FIG. 10B) a DA hole 8 in a part 6. More specifically, as best seen in FIG. 10A, the stem of the vector target 114 will be inserted inside the hole 8. The dashed line through the vector target 114 in FIG. 10B represents the measured hole vector 120, which intersects a pair of optical targets 116 and 118 incorporated in the vector target 114. As previously described, a photogrammetric camera is used to acquire images of vector targets inserted in all of the DA holes of the skin 2 and longeron flange 22. The optical 3-D coordinate measuring machine 10 in FIG. 8 determines the 3-D coordinates of respective points (hereinafter "Point 2" and "Point 1") corresponding to the locations of the optical targets 116 and 118 from the acquired image data. The line in virtual space which connects Points 1 and 2 corresponds to the measured hole vector 120.

Figure 11:
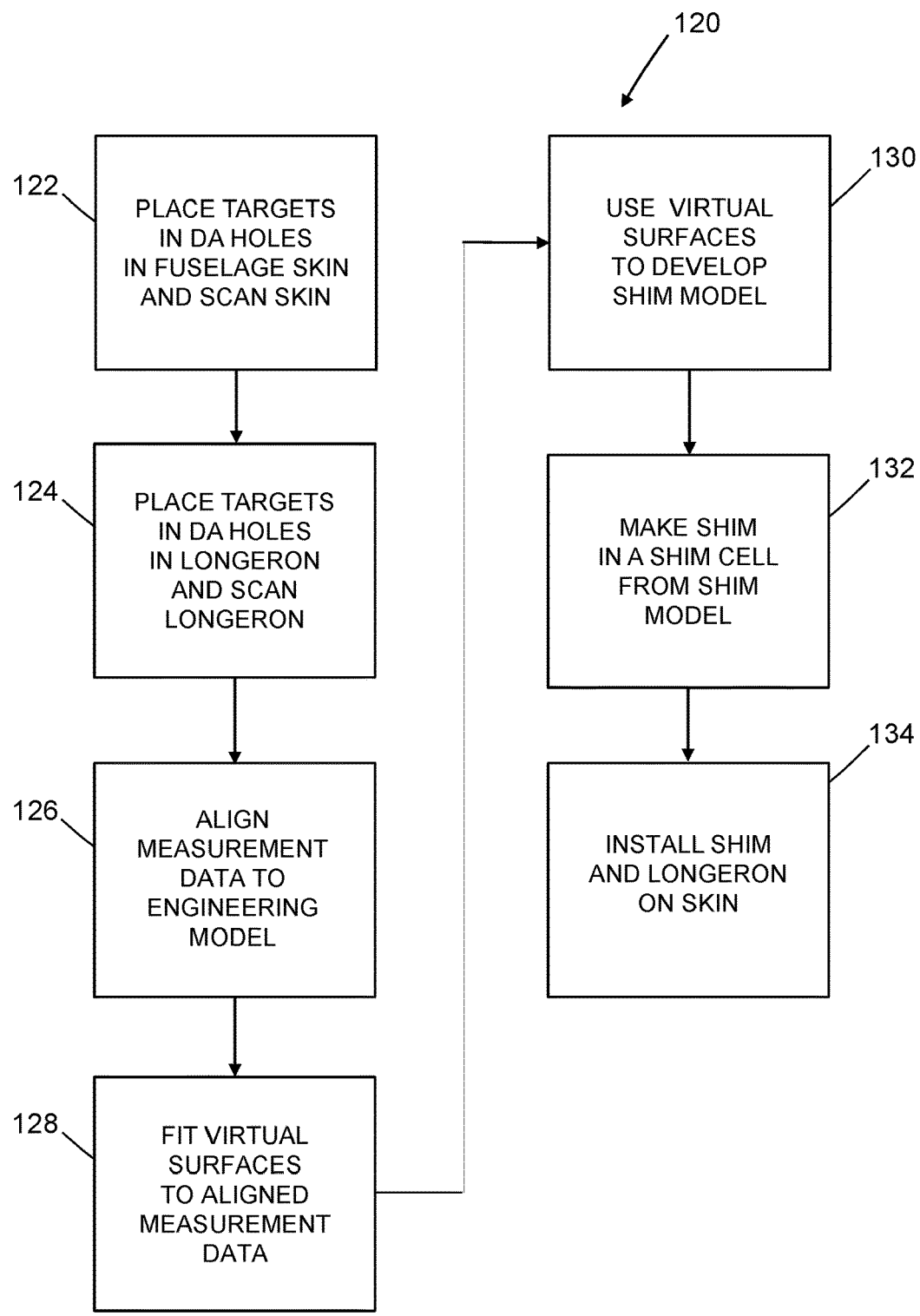
FIG. 11 is a flowchart identifying steps of a method for installing a shim between a longeron and a fuselage skin using photogrammetry to develop a shim model.

FIG. 11 is a flowchart identifying steps of a method for installing a shim 4 between a longeron 20 and a fuselage skin 2 using photogrammetry to develop a shim model in accordance with one embodiment. Optical targets are placed in DA holes in the skin 2 and then the mating surface of skin 2 is scanned using an optical 3-D scanner (e.g., the ATOS optical 3-D scanner commercially available from Gesellschaft für Optische Messtechnik) (steps 122). In addition, a longeron 20 having DA holes that match the DA holes in the skin 2 is scanned with vector targets 112 placed in the DA holes (steps 124). During scanning, the positions of the DA holes are measured using a procedure similar to that described above with reference to FIGS. 10A and 10B. When the surface of a part having DA holes is scanned, the 3-D scanner captures discrete (i.e., point) values from the vector targets 112 that were inserted into the holes. The 3-D scanner recognizes the contrasting white dots acquired from the vector targets as measurement points and derives a point value at the center of each white dot. The vector targets 112 give two points per hole location, which in turn are used to define the position and orientation of the hole axis.

In addition, the 3-D scanner collects a very dense set of point cloud scan data using a grid of points. From this point cloud scan data, the computer system 12 can extrapolate large quantities of points which define the actual surface location and provide an accurate representation of the actual surfaces being measured. Commercially available 3-D scanners can have point densities as high as 16 million points per square foot. The use of such a high-density 3-D scanner enables better capture of the surface definition.

Thus, when the measurement data is exported to the computer system 12, it consists of point cloud scan data representing the scanned surface along with hole vector data representing points that define the axis of each hole. The dense point clouds capture precisely the full surface geometry of the skin 2 and each longeron 20. The locations of the DA holes in each longeron 20 and the locations of the DA holes in the fuselage skin 2 are used to align each set of measurement data to the engineering model (step 126). As previously described, alignment of the longeron web 24 is given priority when the longeron measurement data is aligned to the engineering model.

Still referring to FIG. 11, first and second virtual surfaces are fitted respectively fitted to the aligned measurement data for the longeron 20 and the fuselage skin 2 (step 128). Those virtual surfaces are then used to develop a virtual shim surface and model for each longeron (step 130). Thereafter, respective shims 4 are made in a shim cell from the respective shim models (step 132). Finally, the shims 4 and longerons 20 are installed on the fuselage skin 2 (step 134).

The weighted fit and best fit algorithms described above are part of a software package. This software includes fitting routines to minimize the distances between measured points or developed features. Numerous correlations or relationships are created for each longeron-to-skin instance. For each of these relationships, nominal values are defined along with the minimum and maximum acceptable values. Once all have been defined, the fitting algorithm will attempt to minimize the deviation from nominal of all of the measure point-to-measure point relationships simultaneously within the defined boundaries. When satisfied, the results are a first transformation for moving the virtual longeron web to its desired location relative to the engineering model and a second transformation for moving the virtual skin web to its desired location relative to the engineering model.

In accordance with one implementation, it is assumed that one side of the shim will be flat and all of the surface-to-surface gap deviations are applied with respect to that side. This simplifies the machining of the shims. So after the surfaces are aligned correctly relative to the engineering model, the gap values between these surfaces are recorded and then those values are applied to a nominal interface surface. Based on these values, a shim having a smooth side and a machined side can be fabricated. The shape of the machined side is a function of the longeron flange mating surface-to-fuselage skin mating surface gap values. For the purpose of this methodology, it is assumed that the smooth side of the shim will conform to the actual part surface that it interfaces with.

Referring back to FIG. 7, the shim shape information is exported to a shim cell server as an .xml type file (in step 72). The shim cell server controls the fabrication of the shims based on the shim information provided. The shim gaps are determined after the fittings have been transformed per the fitting algorithm outputs. Thus, when the fittings are later installed by pinning the DA holes and inserting shims having the calculated shapes and dimensions, the relationship of each longeron 20 to the fuselage skin 2 will satisfy all of the engineering requirements.

Figure 12:
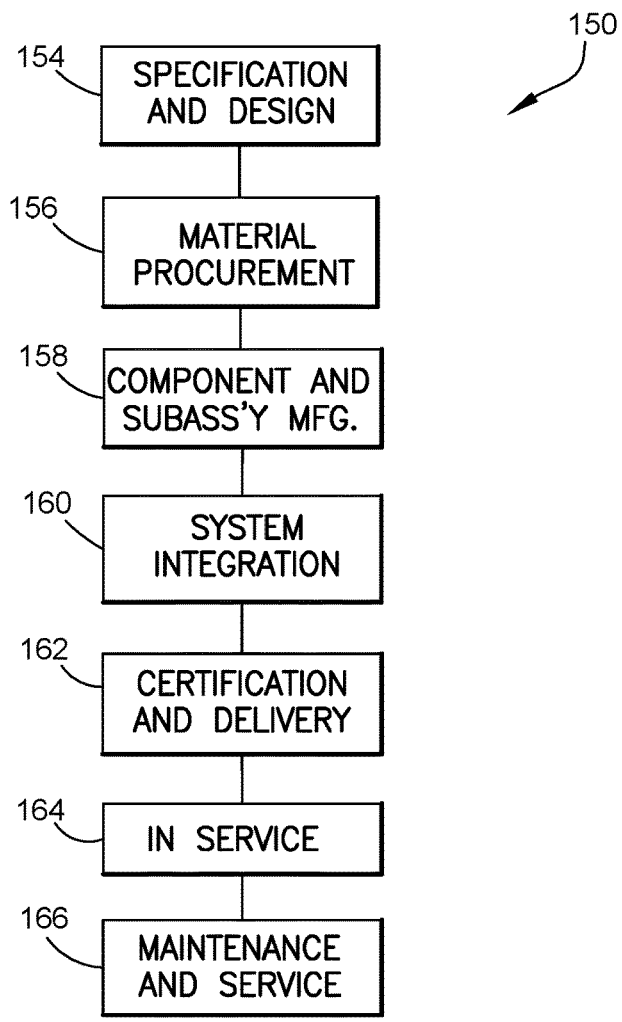
FIG. 12 is a flow diagram of an aircraft production and service methodology.
Figure 13:
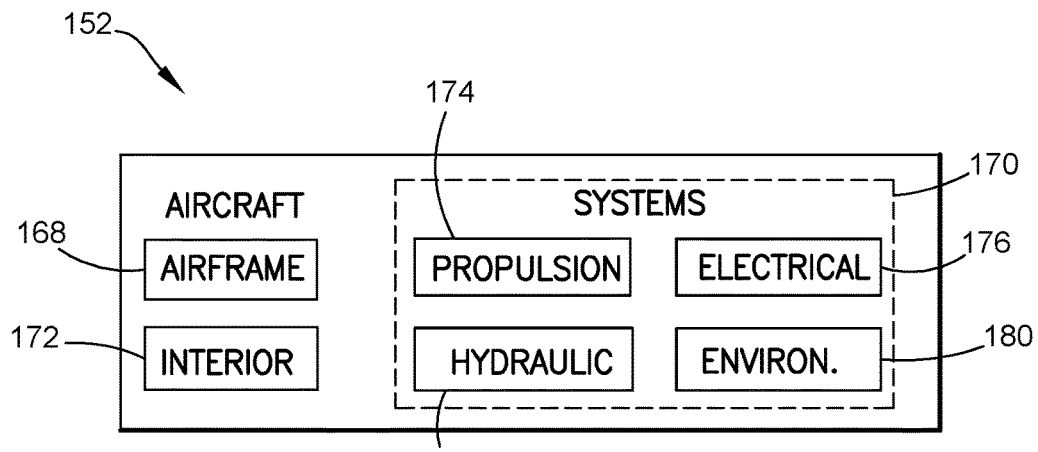
FIG. 13 is a block diagram showing systems of an aircraft.

Embodiments of the disclosure may find use in a variety of potential applications, particularly in the transportation industry, including for example, aerospace, marine and automotive applications. For example, the methodology disclosed above may be employed in an aircraft manufacturing and service method 150 as shown in FIG. 12 for assembling an aircraft 152 as shown in FIG. 13. Aircraft applications of the disclosed embodiments may include, for example, without limitation, assembly and fitting fuselage skins, wings and wing skins, stiffeners, control surfaces, hatches, floor panels, door panels, access panels and empennages, to name a few. During pre-production, exemplary method 150 may include specification and design 154 of the aircraft 152 and material procurement 156. During production, component and subassembly manufacturing 158 and system integration 160 of the aircraft 152 takes place. System integration 160 may include designing, fabricating and installing shims using the predictive shimming process disclosed herein. Thereafter, the aircraft 152 may go through certification and delivery 162 in order to be placed in service 164. While in service by a customer, the aircraft 152 is scheduled for routine maintenance and service 166 (which may also include modification, reconfiguration, refurbishment, and so on).

Each of the processes of method 150 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 13, the aircraft 152 produced by exemplary method 150 may include an airframe 168 with a plurality of systems 170 and an interior 172. Examples of high-level systems 170 include one or more of a propulsion system 174, an electrical system 176, a hydraulic system 178, and an environmental system 180. Any number of other systems may be included. Although an aerospace example is shown, the principles of the disclosure may be applied to other industries, such as the marine and automotive industries. The disclosed embodiments may be used to produce shims that are employed to fit and join various parts, components and subassemblies of the airframe 168.

Systems and methods embodied herein may be employed during any one or more of the stages of the production and service method 150. For example, components or subassemblies corresponding to production process 158 may be fabricated or manufactured in a manner similar to components or subassemblies produced while the aircraft 152 is in service. Also, one or more apparatus embodiments, method embodiments, or a combination thereof may be utilized during the production stages 158 and 160, for example, by substantially expediting assembly of or reducing the cost of an aircraft 152. Similarly, one or more of apparatus embodiments, method embodiments, or a combination thereof may be utilized while the aircraft 152 is in service, for example and without limitation, to maintenance and service 166.

While shim fabricating methodologies have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

As used herein, the term "computer system" should be construed broadly to encompass a system having at least one computer or processor, and which may have multiple computers or processors that communicate through a network or bus. As used in the preceding sentence, the terms "computer" and "processor" both refer to devices having a processing unit (e.g., a central processing unit) and some form of memory (i.e., a non-transitory tangible computer-readable storage medium) for storing a program which is readable by the processing unit.

In the absence of explicit language indicating a particular sequence of steps, the method claims set forth hereinafter should not be construed to require that the steps recited therein be performed in alphabetical order (any alphabetical ordering in the claims is used solely for the purpose of referencing previously recited steps) or in the order in which they are recited. Similarly, in the absence of explicit language indicating non-concurrent steps, the method claims set forth hereinafter should not be construed to exclude any portions of two or more steps being performed concurrently.

In the context of the alignment of unaligned measurement data (acquired from a part) with specified engineering location data (associated with that part) from an engineering model (of an assembly of parts, e.g., an aircraft), the term "aligning" means transforming the unaligned measurement data from the frame of reference of the measurement system to the frame of reference of the engineering model in a manner such that any deviation of the virtual location of a feature (of the part) from its specified engineering location is minimized (if not eliminated). The term "aligning" should not be construed to require a coordinate transformation that precisely locates the part feature at its specified engineering location. As used herein, the term "location" should be construed to include position and orientation.

The invention claimed is:

1. A method for fabricating a shim fittable between first and second parts, comprising:
   (a) measuring a first mating surface, a top surface of a web and mating features of a first part to obtain first measurement data in a frame of reference of a measurement system;
   (b) measuring a second mating surface and mating features of the second part to obtain second measurement data in the frame of reference of the measurement system;
   (c) using a weighted fit algorithm to align the first measurement data to first engineering location data that includes data representing a specified plane locating the web in a frame of reference of an engineering model, the weighted fit algorithm comprising weighting that minimizes an angular deviation of the web from the specified plane;
   (d) aligning the second measurement data to second engineering location data that represents a specified location of the second part in the frame of reference of the engineering model;
   (e) fitting a first virtual surface to a measurement data set of the first aligned measurement data corresponding to the first mating surface;
   (f) fitting a second virtual surface to a measurement data set of the second aligned measurement data corresponding to the second mating surface;

(g) estimating gaps between the first and second virtual surfaces to obtain estimated gaps; and (h) fabricating the shim having a thickness which varies as a function of the estimated gaps.

2. The method as recited in claim 1, further comprising using the estimated gaps to develop a shim model, wherein step (h) comprises fabricating the shim in accordance with the shim model.

3. The method as recited in claim 1, wherein the first part is a structural component of an aircraft and the second part is a skin of the aircraft.

4. The method as recited in claim 1, wherein step (c) comprises aligning mating feature data included in the first measurement data with corresponding mating feature data included in the first engineering location data, and step (d) comprises aligning mating feature data included in the second measurement data with corresponding mating feature data included in the second engineering location data.

5. The method as recited in claim 1, wherein the mating features of the first and second parts are holes in the first part and holes in the second part, and step (a) comprises:

placing optical targets in the holes in the first part;

scanning the first mating surface of the first part using a three-dimensional scanner to acquire first point cloud scan data and first measured hole vector data; and scanning the top surface of the web of the first part using a three-dimensional scanner to acquire second point cloud scan data.

6. The method as recited in claim 5, wherein step (b) comprises:

placing optical targets in the holes in the second part; and scanning the second mating surface of the second part using a three-dimensional scanner to acquire third point cloud scan data and second measured hole vector data.

7. The method as recited in claim 6, wherein step (c) comprises aligning the first measured hole vector data with corresponding hole vector data included in the first engineering location data, and step (d) comprises aligning the second measured hole vector data with corresponding hole vector data included in the second engineering location data.

8. The method as recited in claim 1, wherein the shim has a flat surface and a non-flat surface, the distances between the flat and non-flat surfaces of the shim being equal to the thickness which varies as a function of the estimated gaps.

9. A method for attaching a structural component to a skin of an aircraft, comprising:

(a) using a measurement system to measure a first mating surface, a top surface of a web and mating features of a structural component of an aircraft to obtain first measurement data in a frame of reference of the measurement system;

(b) using the same or a different measurement system to measure a second mating surface and mating features of a skin of the aircraft to obtain second measurement data in a frame of reference of the same or different measurement system;

(c) using a weighted fit algorithm to align the first measurement data to first engineering location data that includes data representing a specified plane locating the web in a frame of reference of an engineering model, the weighted fit algorithm comprising weighting that minimizes an angular deviation of the web from the specified plane;

(d) aligning the second measurement data to second engineering location data that represents a specified location of the skin in the frame of reference of the engineering model;

(e) fitting a first virtual surface to a measurement data set of the first aligned measurement data corresponding to the first mating surface;

(f) fitting a second virtual surface to a measurement data set of the second aligned measurement data corresponding to the second mating surface;

(g) estimating gaps between the first and second virtual surfaces to obtain estimated gaps;

(h) fabricating a shim having a thickness which varies as a function of the estimated gaps; and (i) assembling the structural component and the skin of the aircraft with the shim therebetween.

10. The method as recited in claim 9, further comprising using the estimated gaps to develop a shim model, wherein step (h) comprises fabricating the shim in accordance with the shim model.

11. The method as recited in claim 9, wherein the structural component is a longeron comprising a flange and the web, the first mating surface comprises a surface of the flange, and the skin is a fuselage skin.

12. The method as recited in claim 9, wherein the shim has a flat surface and a non-flat surface, the distances between the flat and non-flat surfaces of the shim being equal to the thickness which varies as a function of the estimated gaps.

* * * * *